(12) United States Patent
Kim et al.

(10) Patent No.: US 12,289,972 B2
(45) Date of Patent: Apr. 29, 2025

(54) DISPLAY DEVICE

(71) Applicant: Samsung Display Co., Ltd., Yongin-Si (KR)

(72) Inventors: Myeong Ho Kim, Hwaseong-si (KR); Jay Bum Kim, Suwon-si (KR); Kyoung Seok Son, Seoul (KR); Seung Jun Lee, Suwon-si (KR); Seung Hun Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 401 days.

(21) Appl. No.: 17/836,386

(22) Filed: Jun. 9, 2022

(65) Prior Publication Data

US 2023/0090058 A1    Mar. 23, 2023

(30) Foreign Application Priority Data

Sep. 23, 2021    (KR) .................. 10-2021-0125742

(51) Int. Cl.
*H10K 59/131*    (2023.01)
*G09G 3/32*    (2016.01)
*H10K 59/121*    (2023.01)

(52) U.S. Cl.
CPC ............ *H10K 59/131* (2023.02); *G09G 3/32* (2013.01); *G09G 2300/0426* (2013.01); *G09G 2300/0819* (2013.01); *G09G 2300/0842* (2013.01); *G09G 2320/0252* (2013.01); *H10K 59/1213* (2023.02); *H10K 59/1216* (2023.02)

(58) Field of Classification Search
CPC ............ H10K 59/1216; H10K 59/131; H10K 59/1213; G09G 2300/0426; G09G 2300/0842; G09G 2300/0861; G09G 2300/0819; G09G 3/32; G09G 3/3233; G09G 3/3648; G09G 2320/0252; H01L 27/1222; H01L 27/1225; H01L 27/1255; H01L 27/1214; H01L 27/124
See application file for complete search history.

(56) References Cited

U.S. PATENT DOCUMENTS

2018/0350891 A1* 12/2018 Kim .................... H01L 27/1251
2019/0148477 A1* 5/2019 Park ..................... G09G 3/3233
                                                          257/40

FOREIGN PATENT DOCUMENTS

KR    10-2019-0073903 A    6/2019
KR       10-2034254 B1    10/2019
(Continued)

*Primary Examiner* — Jose R Diaz
(74) *Attorney, Agent, or Firm* — Innovation Counsel LLP

(57) ABSTRACT

Provided is display device comprising a substrate; a first semiconductor layer disposed on the substrate and having a plurality of transistors; a second semiconductor layer disposed on the first semiconductor layer and having a plurality of transistors; a first data conductive layer disposed on the second semiconductor layer; a first metal layer disposed on the first data conductive layer; and a second metal layer disposed on the first metal layer, wherein the first metal layer includes a first storage electrode and a first input electrode, the second metal layer includes a second storage electrode and a second input electrode, the first storage electrode and the second storage electrode configure a storage capacitor, and the first input electrode and the second input electrode configure an input capacitor.

20 Claims, 21 Drawing Sheets

(56) References Cited

FOREIGN PATENT DOCUMENTS

| KR | 10-2020-0029103 A | 3/2020 |
|----|-------------------|--------|
| KR | 10-2021-0100785 A | 8/2021 |

\* cited by examiner

FIG. 5
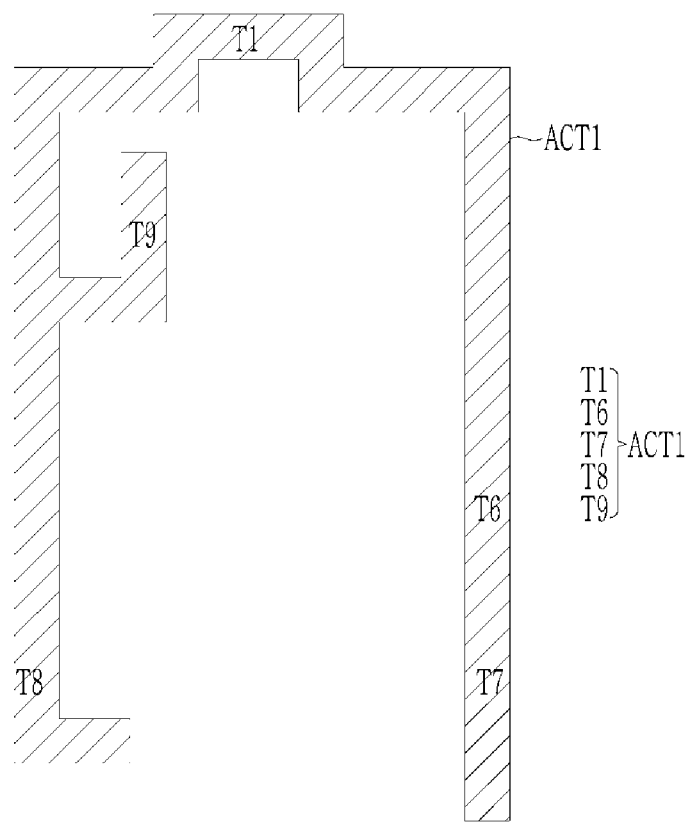
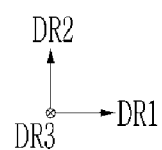

DISPLAY DEVICE

CROSS-REFERENCE TO RELATED APPLICATION

This application claims priority to and the benefit of Korean Patent Application No. 10-2021-0125742 filed in the Korean Intellectual Property Office on Sep. 23, 2021, the entire contents of which are incorporated herein by reference.

BACKGROUND

(a) Field

The present disclosure generally relates to a display device. More particularly, the present disclosure relates to a display device capable of fast driving with high resolution.

(b) Description of the Related Art

A display device represents a device for displaying images on a screen, and it may be a liquid crystal display (LCD) and an organic light emitting diode display (OLED). The display device is used for various electronic devices such as portable phones, GPS, digital cameras, electronic books, portable game devices, or various terminals.

The display device may include a plurality of pixels disposed in a row direction and a column direction. Various elements such as transistors or capacitors and various wires for supplying signals to the elements may be positioned in the respective pixels.

The above information disclosed in this Background section is only for enhancement of understanding of the background of the disclosure, and therefore it may contain information that does not form the prior art that is already known in this country to a person of ordinary skill in the art.

SUMMARY

The present disclosure has been made in an effort to provide a display device capable of fast driving with high resolution.

An embodiment of the present disclosure provides a display device including: a substrate; a first semiconductor layer disposed on the substrate and having a plurality of transistors; a second semiconductor layer disposed on the first semiconductor layer and configuring a plurality of transistors; a first data conductive layer disposed on the second semiconductor layer; a first metal layer disposed on the first data conductive layer; and a second metal layer disposed on the first metal layer, wherein the first metal layer includes a first storage electrode and a first input electrode, the second metal layer includes a second storage electrode and a second input electrode, the first storage electrode and the second storage electrode configure a storage capacitor, and the first input electrode and the second input electrode configure an input capacitor.

The display device may further include a first gate conductive layer disposed between the first semiconductor layer and the second semiconductor layer, wherein the first gate conductive layer may include a first gate electrode, a sixth gate electrode, a seventh gate electrode, an eighth gate electrode, and a ninth gate electrode.

The display device may further include a second gate conductive layer disposed between the second semiconductor layer and the first metal layer, wherein the second gate conductive layer may include a second gate electrode, a third gate electrode, a fourth gate electrode, and a fifth gate electrode.

The first semiconductor layer may include a polycrystalline semiconductor, and the first semiconductor layer may configure a first transistor, a sixth transistor, a seventh transistor, an eighth transistor, and a ninth transistor together with the first gate conductive layer.

The second semiconductor layer may include an oxide semiconductor, and the second semiconductor layer may configure a second transistor, a third transistor, a fourth transistor, and a fifth transistor together with the second gate conductive layer.

The display device may further include an initialization control line, an initialization voltage line, and a bias voltage line disposed on a same layer as the first metal layer, wherein the initialization control line may be connected to the fourth gate electrode, the initialization voltage line may be connected to a second semiconductor layer of the fourth transistor, and the bias voltage line may be connected to a first semiconductor layer of the eighth transistor.

The first storage electrode may be electrically connected to a second semiconductor layer of the third transistor.

The display device may further include a second data conductive layer disposed on the second metal layer, wherein the second data conductive layer may include a data line, a driving voltage line, and a connecting member.

The first input electrode and the second storage electrode may be connected to each other through the connecting member.

The first input electrode may include a protrusion which does not overlap the second input electrode, and the first input electrode may be connected to the second storage electrode at the protrusion.

The second input electrode may be electrically connected to the data line.

Capacitance of the storage capacitor may correspond to capacitance of the input capacitor.

The storage capacitor may overlap the first transistor.

The input capacitor may overlap a portion of the second transistor and a portion of the fifth transistor.

The display device may include a first emission control line and a second emission control line disposed on a same layer as the first data conductive layer, the first emission control line may be connected to the ninth gate electrode, and the second emission control line may be connected to the sixth gate electrode.

Another embodiment of the present disclosure provides a display device including: a substrate; a plurality of transistors disposed on the substrate and including a polycrystalline semiconductor; a plurality of transistors disposed on a plurality of transistors including the polycrystalline semiconductor and including an oxide semiconductor; and a first capacitor and a second capacitor which are disposed on the transistors including an oxide semiconductor.

The first capacitor and the second capacitor may be disposed on a same layer.

The display device may further include a first data conductive layer disposed between the transistors including an oxide semiconductor and the first capacitor, and a second data conductive layer disposed on the first capacitor.

The first capacitor may include a first electrode connected to the first data conductive layer and a second electrode connected to the second data conductive layer.

The display device may include a plurality of wires connected to the transistors, at least some of the wires may be disposed on a same layer as the first data conductive layer, and at least some of the wires may be disposed on a same layer as the first electrode.

According to the embodiments, the fast-driven display device with high resolution is provided.

BRIEF DESCRIPTION OF THE DRAWINGS

FIG. 5, FIG. 7, FIG. 9, FIG. 11, FIG. 13, FIG. 15, FIG. 17, and FIG. 19 show layout diagrams of a pixel for conductive layers according to an embodiment described with reference to FIG. 3.

DETAILED DESCRIPTION OF THE EMBODIMENTS

Figure 1:
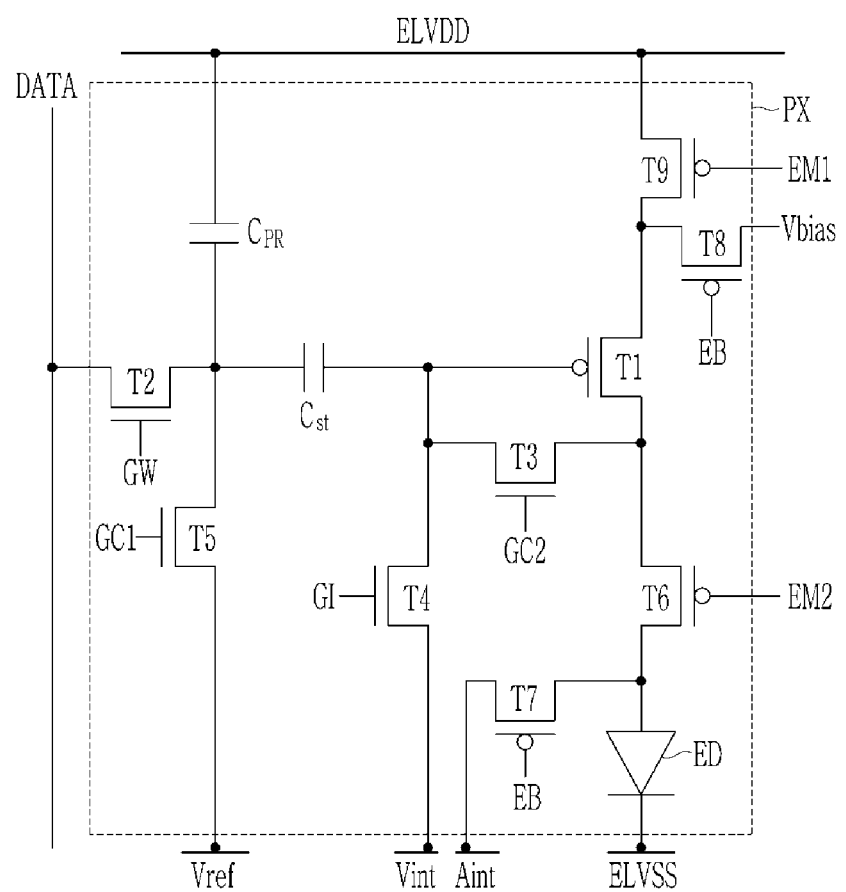
FIG. 1 shows a circuit diagram of a pixel according to the present embodiment.

The present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure.

Parts that are irrelevant to the description will be omitted to clearly describe the present disclosure, and the same elements will be designated by the same reference numerals throughout the specification.

The size and thickness of each configuration shown in the drawings are arbitrarily shown for better understanding and ease of description, but the present disclosure is not limited thereto. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

FIG. 1 shows a circuit diagram of a pixel according to the present embodiment. Referring to FIG. 1, the pixel (PX) according to the present embodiment includes nine transistors (T1, T2, T3, T4, T5, T6, T7, T8, and T9) connected to signal lines, two capacitors (Cst and Cpr), and a light emitting diode (ED).

The emissive display device includes a display area for displaying images, and the pixel (PX) is arranged in the display area in various forms.

The signal lines may include a reference voltage line (Vref), a first-A scan line (GC1), a first-B scan line (GC2), a second scan line (GW), a first emission control line (EM1), a second emission control line (EM2), an initialization control line (GI), a second emission control line (EM2), an initialization voltage line (Vint), a bypass control line (EB), a bias voltage line (Vbias), an anode initialization voltage line (Aint), a data line (DATA), and a driving voltage line (ELVDD).

The driving transistor (T1) controls a current that is output according to an applied data voltage. An output driving current is applied to the light emitting diode (ED) to control brightness of the light emitting diode (ED) according to the data voltage. For this purpose, a first electrode of the driving transistor (T1) is disposed to receive a driving voltage. The first electrode is connected to the driving voltage line (ELVDD) through the ninth transistor (T9). The driving transistor (T1) may have a p-type transistor characteristic, and may include a polycrystalline semiconductor.

The first electrode of the driving transistor (T1) receives a bias voltage through the eighth transistor (T8), and maintains a voltage at the first electrode of the driving transistor (T1) at a predetermined level of voltage.

A second electrode of the driving transistor (T1) outputs a current to the light emitting diode (LED). The second electrode of the driving transistor (T1) passes through the sixth transistor (T6) and is connected to an anode of the light emitting diode (LED). A gate electrode (G1) of the driving transistor (T1) is connected to the storage capacitor (Cst). A voltage at a gate electrode of the driving transistor (T1) is changed according to a voltage stored in the storage capacitor (Cst), and a current output by the driving transistor (T1) is changed.

The second transistor (T2) receives a data voltage into the pixel (PX). A gate electrode is connected to the second scan line (GW), the first electrode is connected to the data line (DATA), and the second electrode is connected to the storage capacitor (Cst). When the second transistor (T2) is turned on according to a scan signal transmitted through the second scan line (GW), the data voltage transmitted through the data line (DATA) is transmitted to the first electrode of the driving transistor (T1). The second transistor (T2) may have an n-type transistor characteristic, and may include an oxide semiconductor.

The third transistor (T3) compensates a threshold voltage of the driving transistor (T1) to the voltage stored in the storage capacitor (Cst) and stores the same. The third transistor (T3) may have an n-type transistor characteristic, and may include an oxide semiconductor.

A gate electrode of the third transistor (T3) is connected to the first-B scan line (GC2), a first electrode of the third transistor (T3) is connected to the gate electrode of the driving transistor (T1) and the storage capacitor (Cst), and a second electrode thereof is connected to the second electrode of the driving transistor (T1). That is, when the driving transistor (T1) is diode-connected, and the driving transistor (T1) is turned on by the voltage applied to the storage capacitor (Cst), negative charges stored in the storage capacitor (Cst) are discharged and the voltage of the storage capacitor (Cst) is increased. The driving transistor (T1) is turned off at a threshold voltage of the driving transistor (T1)

and the voltage is no longer reduced so the voltage stored in the storage capacitor (Cst) becomes the threshold voltage value of the driving transistor (T1). When each the driving transistor (T1) has a different threshold voltage by the above-noted structure, the respective pixel circuits may perform compensation for the operation.

The gate electrode of the third transistor (T3) is connected to the first-B scan line (GC2), and the gate electrode of the second transistor (T2) is connected to the second scan line (GW). Therefore, a pixel data writing process and a voltage compensating process are performed at different timings so fast driving is allowable. That is, to be described in detail with reference to FIG. 2, the display device according to the present embodiment separates the compensation operation for turning on the third transistor and the data writing operation for turning on the second transistor. The conventional display device including seven transistors and one capacitor simultaneously perform the data writing operation and the compensation operation so it was not allowed to reduce one timing to be lower than a predetermined level, and it is difficult to achieve the fast driving. However, the display device according to the present embodiment allows the fast driving.

The fourth transistor (T4) initializes the gate electrode of the driving transistor (T1) and the second storage electrode of the storage capacitor (Cst). The gate electrode (G4) is connected to the initialization control line (GI), and the first electrode is connected to the initialization voltage line (Vint). The second electrode of the fourth transistor (T4) is connected to the second storage electrode of the storage capacitor (Cst) and the gate electrode (G1) of the driving transistor (T1). The fourth transistor (T4) transmits an initialization voltage to the gate electrode of the driving transistor (T1) and the storage capacitor (Cst) according to the signal received through the initialization control line (GI). Accordingly, a gate voltage at the gate electrode of the driving transistor (T1) and the storage capacitor (Cst) are initialized. The initialization voltage may have a low voltage value and may turn on the driving transistor (T1). The fourth transistor (T4) may have an n-type transistor characteristic, and may include an oxide semiconductor.

A gate electrode of the fifth transistor (T5) is connected to the first-B scan line (GC1), a first electrode is connected to the reference voltage line (Vref), and a second electrode is connected to the first electrode of the input capacitor (Cpr) and the second electrode of the second transistor (T2). The fifth transistor (T5) initializes the voltage at the first electrode of the input capacitor (Cpr) (or the second electrode of the second transistor (T2)) to be a reference voltage. The fifth transistor (T5) may have an n-type transistor characteristic, and may include an oxide semiconductor.

The sixth transistor (T6) transmits the driving current output by the driving transistor (T1) to the light emitting diode (ED). A gate electrode is connected to the second emission control line (EM2), and a first electrode is connected to the second electrode of the driving transistor (T1). A second electrode of the sixth transistor (T6) is connected to an anode of the light emitting diode (ED). The sixth transistor (T6) may have a p-type transistor characteristic, and may include a polycrystalline semiconductor.

The seventh transistor (T7) initializes the anode of the light emitting diode (ED). A gate electrode is connected to the bypass control line (EB), a first electrode is connected to the anode of the light emitting diode (ED), and a second electrode is connected to the anode initialization voltage line (Aint). When the seventh transistor (T7) is turned on by the bypass signal, an anode initialization voltage is applied to the anode of the light emitting diode (ED) to be initialized. The seventh transistor (T7) may have a p-type transistor characteristic, and may include a polycrystalline semiconductor.

The eighth transistor (T8) applies the bias voltage to the first electrode of the driving transistor (T1) so that a voltage level of the first electrode of the driving transistor (T1) may not digress from a predetermined range. A gate electrode of the eighth transistor (T8) is connected to the bypass control line (EB), a first electrode of the eighth transistor (T8) is connected to the bias voltage line (Vbias), and a second electrode of the eighth transistor (T8) is connected to the first electrode of the driving transistor (T1). The eighth transistor (T8) may have a p-type transistor characteristic, and may include a polycrystalline semiconductor.

The ninth transistor (T9) transmits the driving voltage to the driving transistor (T1). A gate electrode is connected to the first emission control line (EM1), and a first electrode is connected to the driving voltage line (ELVDD). A second electrode of the ninth transistor (T9) is connected to the first electrode of the driving transistor (T1). The ninth transistor (T9) may have a p-type transistor characteristic, and may include a polycrystalline semiconductor.

The driving transistor (T1) may include a polycrystalline semiconductor. The sixth transistor (T6), the seventh transistor (T7), the eighth transistor (T8), and the ninth transistor (T9) may include polycrystalline semiconductors. The second transistor (T2), the third transistor (T3), the fourth transistor (T4), and the fifth transistor (T5) may include oxide semiconductors. However, without being limited thereto, at least one of the sixth transistor (T6), the seventh transistor (T7), the eighth transistor (T8), and the ninth transistor (T9) may include the oxide semiconductor. By allowing the third transistor (T3) and the fourth transistor (T4) to include the semiconductor materials that are different from the driving transistor (T1) in the present embodiment, they may be driven more stably, and reliability may be increased.

Figure 2:
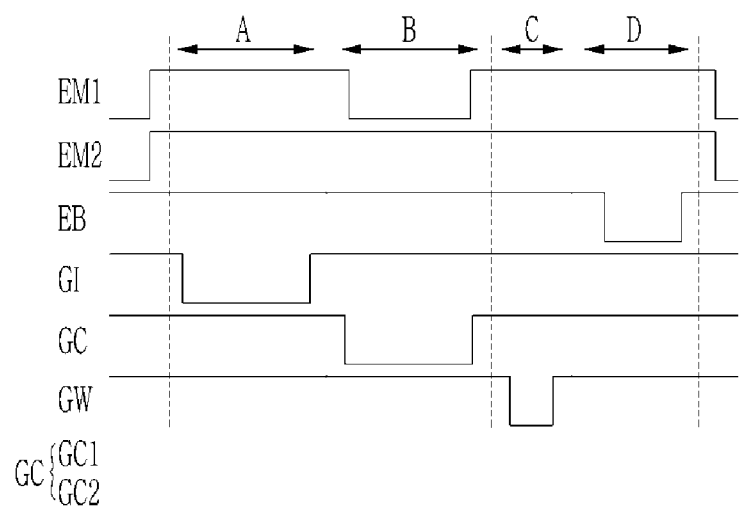
FIG. 2 shows a waveform diagram applied to a pixel of FIG. 1.

An operation of the pixel according to the present embodiment will now be described. FIG. 2 shows a waveform diagram applied to a pixel of FIG. 1. Referring to FIG. 2, the operation of the pixel includes an initialization section (A), a compensation section (B), a data writing section (C), and a bias section (D). A period after the bias section (D) and before the initialization section (A) corresponds to an emission section.

For the initialization section (A), a low-level previous-stage scan signal is supplied to the pixel (PX) through the initialization control line (GI). The fourth transistor (T4) receives the previous-stage scan signal and is turned on, and the initialization voltage is applied to the gate electrode of the driving transistor (T1) and the storage capacitor (Cst) through the fourth transistor (T4). As a result, the driving transistor (T1) and the storage capacitor (Cst) are initialized. The initialization voltage may have a low voltage so that the driving transistor (T1) may be turned on.

For the compensation section (B), an emission control signal is supplied to the pixel (PX) through the first emission control line (EM1). The ninth transistor (T9) receives the emission control signal and is turned on. For the compensation section, a scan signal is supplied to the pixel (PX) through the first scan line (GC). The third transistor (T3) and the fifth transistor (T5) receive the scan signal and are respectively turned on. The first scan line (GC) shown in FIG. 2 includes the first-A scan line (GC1) and the first-B scan line (GC2) shown in FIG. 1.

For the compensation section (B), the fifth transistor (T5) is turned on, and the reference voltage initializes the voltages at the first electrode of the input capacitor (Cpr) and the second electrode of the second transistor (T2) to be the reference voltage through the reference voltage line (Vref).

As the ninth transistor (T9) is turned on, then the driving voltage is transmitted to the driving transistor (T1). For the initialization section, as an initialization voltage is applied to the gate electrode (G1), then the driving transistor (T1) is turned on. As the third transistor (T3) is turned on, the gate electrode and the second electrode of the driving transistor (T1) become diode-connected. Therefore, the threshold voltage of the driving transistor (T1) is compensated by the third transistor (T3).

For the data writing section (C), a low-level scan signal is supplied to the pixel (PX) through the second scan line (GW). The second transistor (T2) is turned on by the low-level scan signal. When the second transistor (T2) is turned on, the data voltage passes through the second transistor (T2) and the storage capacitor (Cst), and is transmitted to the driving transistor (T1).

For the bias section (D), a low-level bypass signal is supplied to the pixel (PX) through the bypass control line (EB). The seventh transistor (T7) receives the low-level bypass signal and is turned onto receive the anode initialization voltage from the anode initialization voltage line (flint), and applies the same to the anode of the light emitting diode (LED) through the seventh transistor (T7). As a result, the anode of the light emitting diode (LED) is initialized.

The eighth transistor (T8) receives the low-level bypass signal through the bypass control line (EB), is turned on, and transmits the bias voltage to the driving transistor (T1) from the bias voltage line (Vbias).

For the emission section, the emission control signal supplied from the second emission control line (EM2) has a low level value, and the sixth transistor (T6) is turned on. The emission control signal supplied to the first emission control line (EM1) has a low level, and the ninth transistor (T9) is turned on.

As a result, the driving voltage is applied to the first electrode of the driving transistor (T1), and the second electrode of the driving transistor (T1) is connected to the light emitting diode (LED).

Figure 3:
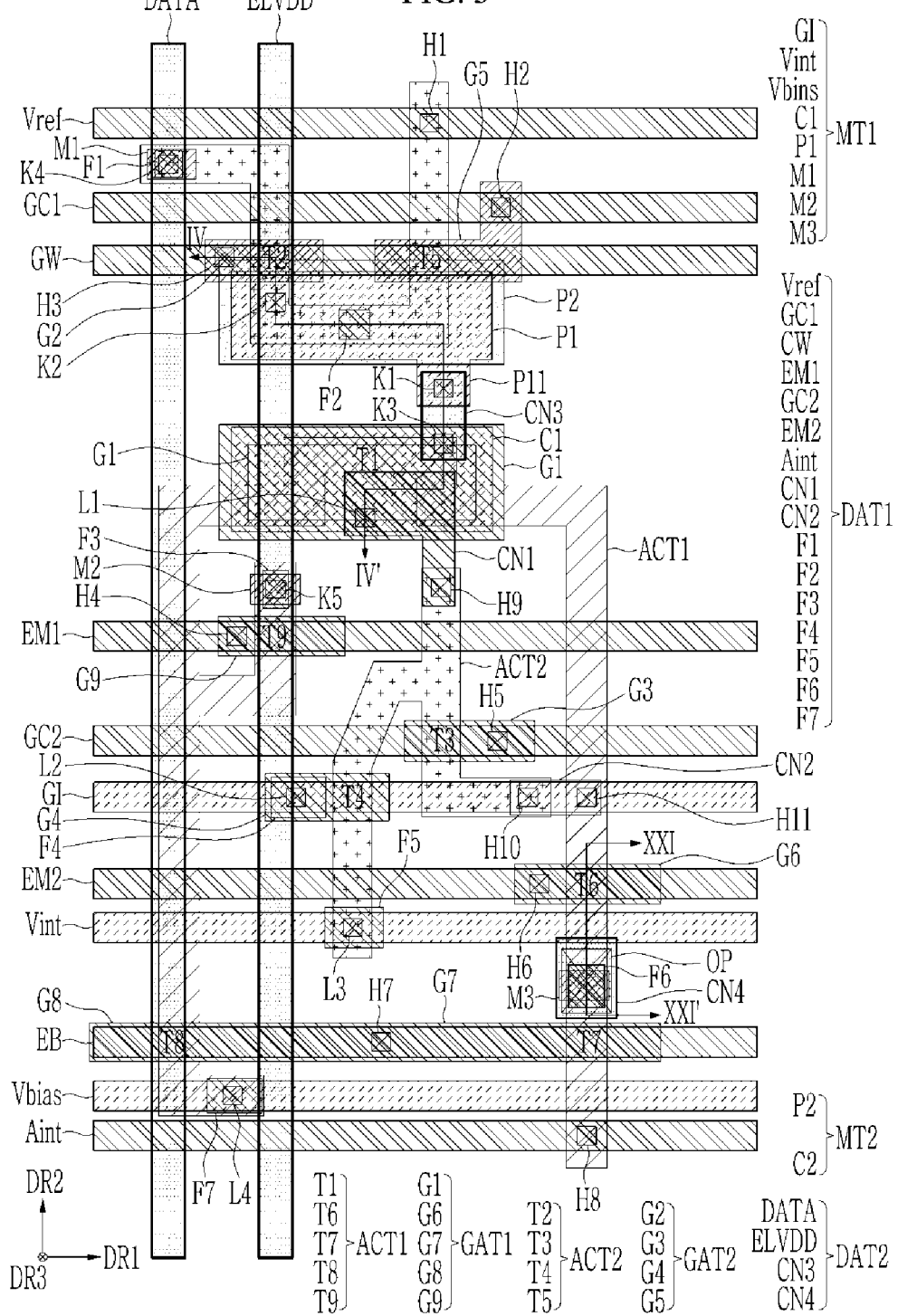
FIG. 3 shows a layout view of a pixel according to an embodiment.

An embodiment for realizing the pixel operated by the above-noted circuit configuration and applied signals is shown in FIG. 3.

Figure 4:
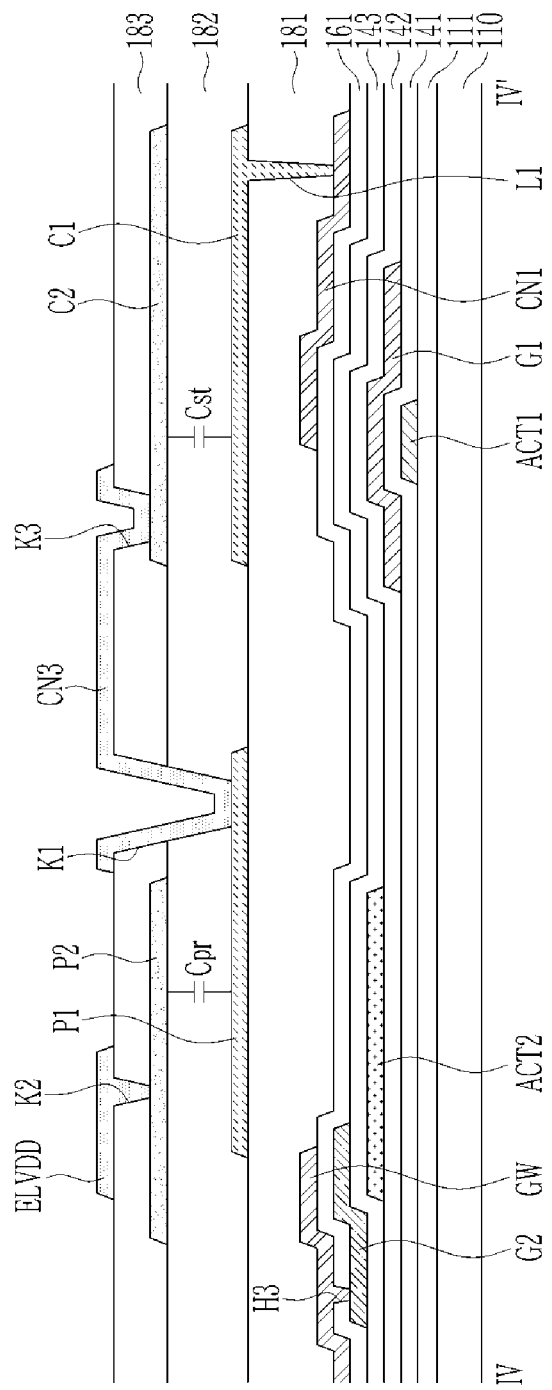
FIG. 4 shows a cross-sectional view with respect to a line IV-IV' of FIG. 3.

FIG. 3 shows a layout view of a pixel according to an embodiment, and FIG. 4 shows a cross-sectional view with respect to a line IV-IV' of FIG. 3. FIG. 5, FIG. 7, FIG. 9, FIG. 11, FIG. 13, FIG. 15, FIG. 17, and FIG. 19 show layout diagrams of a pixel for conductive layers according to an embodiment described with reference to FIG. 3. FIG. 6, FIG. 8, FIG. 10, FIG. 12, FIG. 14, FIG. 16, FIG. 18, and FIG. 20 show a stacking order of layers with the same cross-section as FIG. 4.

Figure 6:
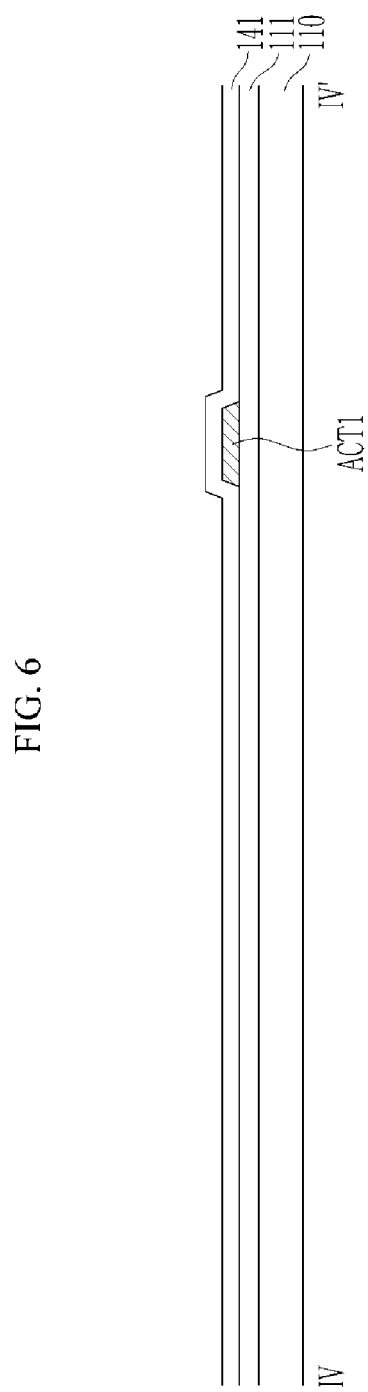
FIG. 6, FIG. 8, FIG. 10, FIG. 12, FIG. 14, FIG. 16, FIG. 18, and FIG. 20 show a stacking order of layers with the same cross-section as FIG. 4.

FIG. 5 and FIG. 6 illustrate a first semiconductor layer (ACT1). Referring to FIG. 3 to FIG. 6, the first semiconductor layer (ACT1) may be positioned on a substrate (SUB). The first semiconductor layer (ACT1) may include a polycrystalline semiconductor material. FIG. 5 shows the first semiconductor layer (ACT1). The first semiconductor layer (ACT1) may include channels, first electrodes, and second electrodes of each of the driving transistor (T1), the sixth transistor (T6), the seventh transistor (T7), the eighth transistor (T8), and the ninth transistor (T9). FIG. 3, FIG. 5, FIG. 7, FIG. 9, FIG. 11, FIG. 13, FIG. 15, FIG. 17, and FIG. 19 denote the transistors. The channels of the each transistor may be disposed in center region of the transistor, and the first electrode and the second electrode of the transistors may be disposed on each region of the channels of the transistors.

The channel of the driving transistor (T1) may have a shape that is bent in a plan view. However, the shape of the channel of the driving transistor (T1) is not limited thereto, and it is modifiable in many ways. For example, the channel of the driving transistor (T1) may be bent to have another shape, and it may have a bar shape. Referring to FIGS. 3, 4, 5, and 6, a buffer layer 111 may be positioned between the substrate 110 and the first semiconductor layer (ACT1). The buffer layer 111 may have a single-layered or multi-layered structure. The buffer layer 111 may include an organic insulating material or an inorganic insulating material. The buffer layer 111 may include a silicon nitride or a silicon oxide. The buffer layer 111 may be omitted depending on embodiments.

Referring to FIGS. 3, 4, 5, and 6, a first gate insulating layer 141 may be positioned on the first semiconductor layer (ACT1). The first gate insulating layer 141 may include a silicon oxide (SiOx), a silicon nitride (SiNx), and a silicon oxynitride (SiOxNy), and may have a single-layered or multi-layered structure including the same.

Figure 7:
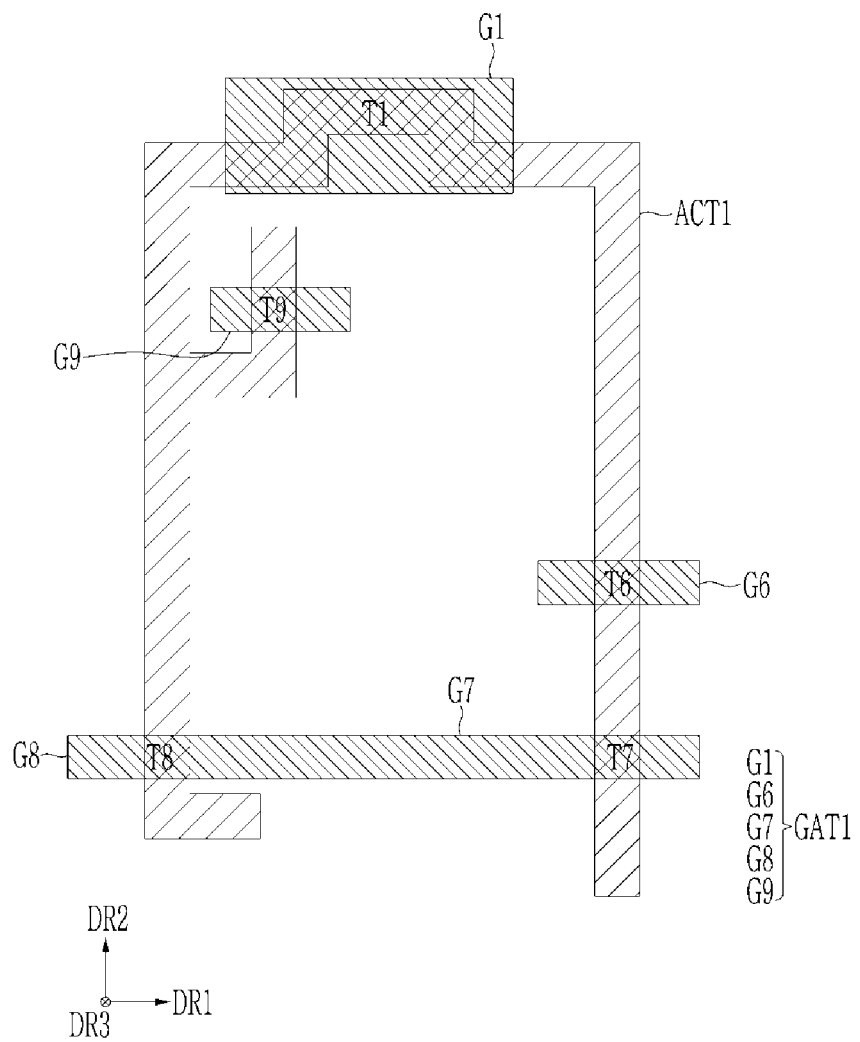
Figure 8:
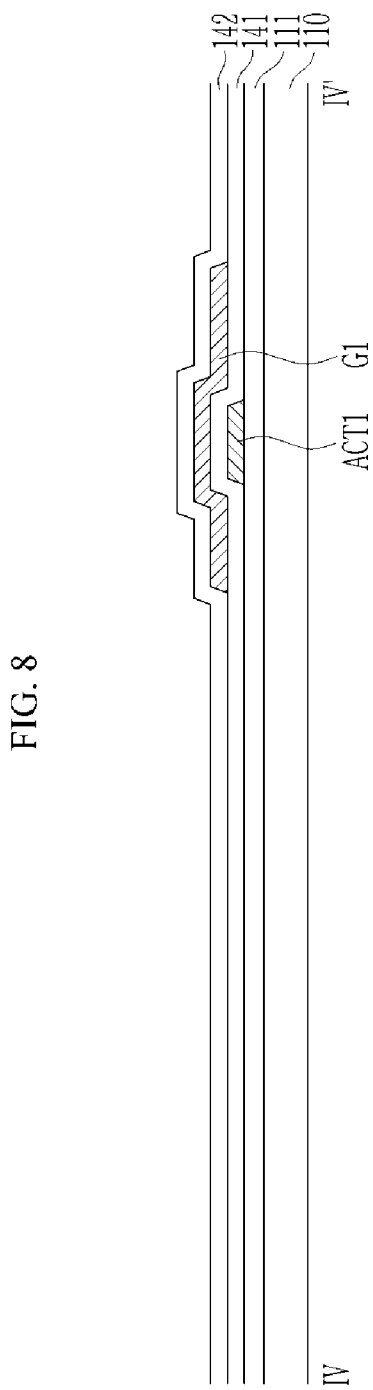

FIG. 7 and FIG. 8 show a first semiconductor layer (ACT1) and a first gate conductive layer (GAT1). The first gate conductive layer (GAT1) may be positioned on the first gate insulating layer 141. The first gate conductive layer (GAT1) may include the gate electrode (G1) of the driving transistor (T1), the gate electrode (G9) of the ninth transistor (T9), the gate electrode (G6) of the sixth transistor (T6), the gate electrode (G7) of the seventh transistor (T7), and the gate electrode (G8) of the eighth transistor (T8). The gate electrode (G7) of the seventh transistor (T7) and the gate electrode (G8) of the eighth transistor (T8) may be connected to each other.

A doping process may be performed after the first gate conductive layer (GAT1) is formed. The first semiconductor layer (ACT1) covered by the first gate conductive layer (GAT1) is not doped, and a portion of the first semiconductor layer (ACT1) that is not covered by a first gate conductive layer (GAT2) may be doped and may have the same characteristic as a conductor. The doping process may be progressed with a p-type dopant, and the driving transistor (T1), the sixth transistor (T6), the seventh transistor (T7), the eighth transistor (T8), and the ninth transistor (T9) including the first semiconductor layer (ACT1) may have a p-type transistor characteristic. A plasma process may be performed instead of the doping process. The first semiconductor layer (ACT1) may become conductive by the plasma process.

Referring to FIG. 3, FIG. 4, FIG. 7, and FIG. 8, a second gate insulating layer 142 may be positioned on the first gate conductive layer (GAT1) including a first gate electrode (G1) and the first gate insulating layer 141. The second gate insulating layer may include a silicon oxide (SiOx), a silicon nitride (SiNx), and a silicon oxynitride (SiOxNy), and may have a single-layered or multi-layered structure including the same.

Figure 9:
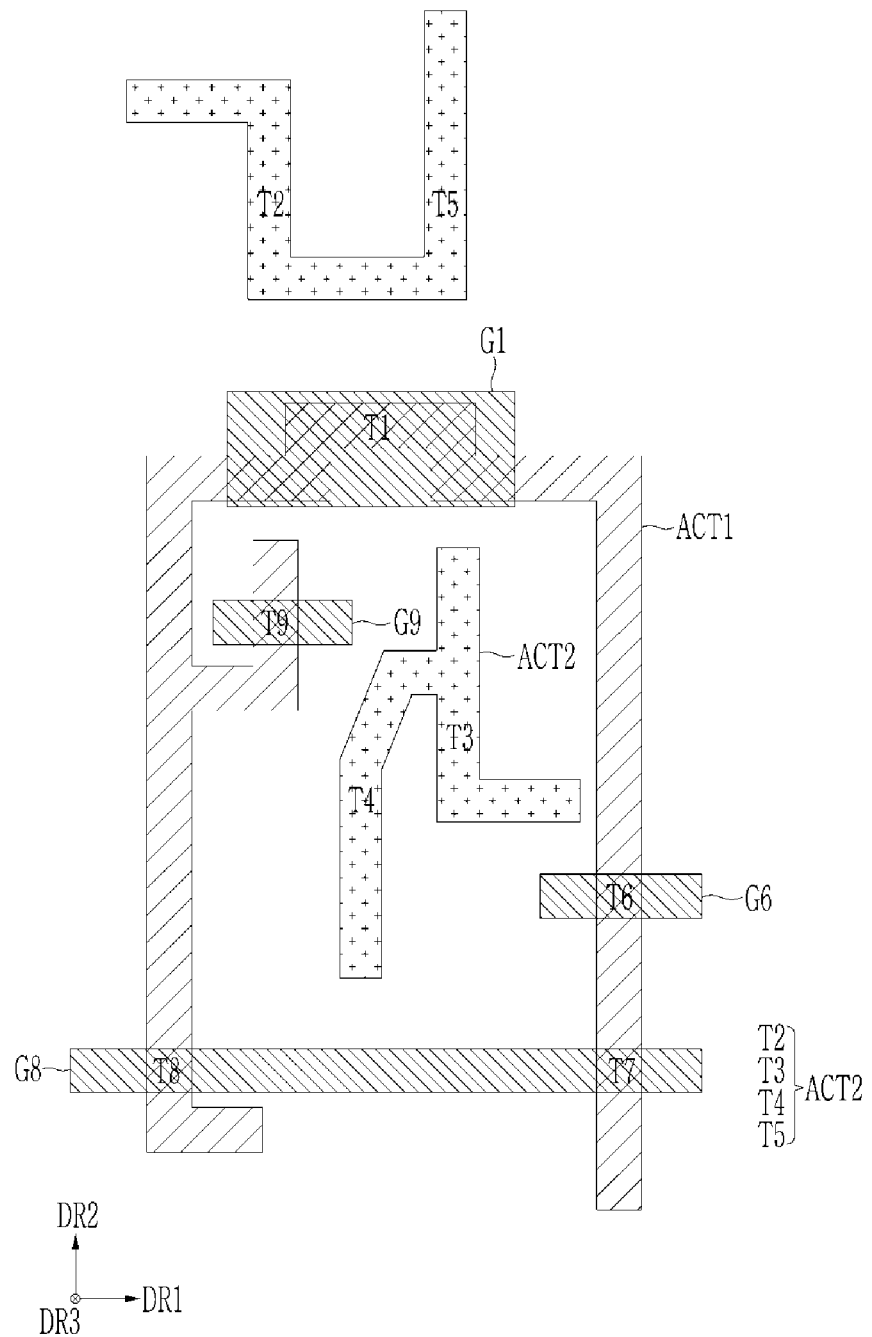
Figure 10:
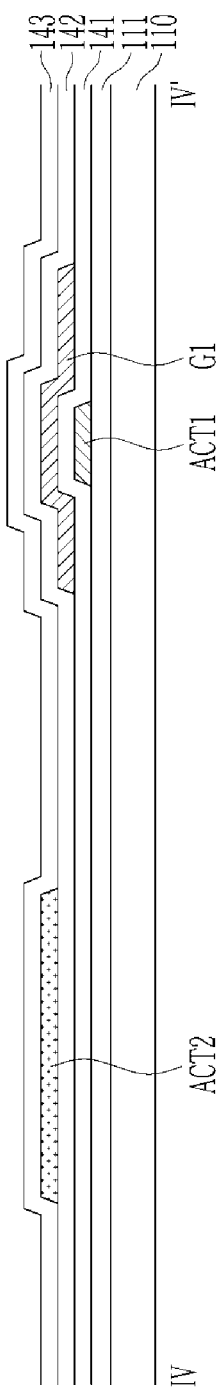

FIG. 9 and FIG. 10 illustrate the first semiconductor layer (ACT1), the first gate conductive layer (GAT1), and the second semiconductor layer (ACT2). Referring to FIG. 3, FIG. 4, FIG. 9, and FIG. 10, the second semiconductor layer (ACT2) may be positioned on the second gate insulating layer 142.

The second semiconductor layer (ACT2) may include at least one of unary metal oxides such as an indium (In)-based oxide, a tin (Sn)-based oxide, or a zinc (Zn)-based oxide;

binary metal oxides such as an In—Zn-based oxide, an Sn—Zn-based oxide, an Al—Zn-based oxide, a Zn—Mg-based oxide, an In—Sn—Mg based oxide, an In—Mg-based oxide, or an In—Ga-based oxide; ternary metal oxides such as an In—Ga—Zn-based oxide, an In—Al—Zn-based oxide, an In—Sn—Zn-based oxide, an Sn—Ga—Zn-based oxide, an Al—Ga—Zn-based oxide, an Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn based oxide, an In—Tb—Zn-based oxide, an In—Dy—Zn-based oxide, an In—Ho—Zn based-oxide, an In—Er—Zn-based oxide, an In—Tm—Zn-based oxide, an In—Yb—Zn-based oxide, or an In—Lu—Zn-based oxide; and quaternary metal oxides such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the second semiconductor layer (ACT2) may include the indium-gallium-zinc oxide (IGZO) from among the In—Ga—Zn-based oxides.

The second semiconductor layer (ACT2) may include the channels, the first electrodes, and the second electrodes of the second transistor (T2), the third transistor (T3), the fourth transistor (T4), and the fifth transistor (T5). Referring to FIG. 4 and FIG. 10, a third gate insulating layer 143 may be positioned on the second semiconductor layer (ACT2). The third gate insulating layer 143 may include a silicon oxide (SiOx), a silicon nitride (SiNx), and a silicon oxynitride (SiOxNy), and may have a single-layered or multi-layered structure including the same.

Figure 11:
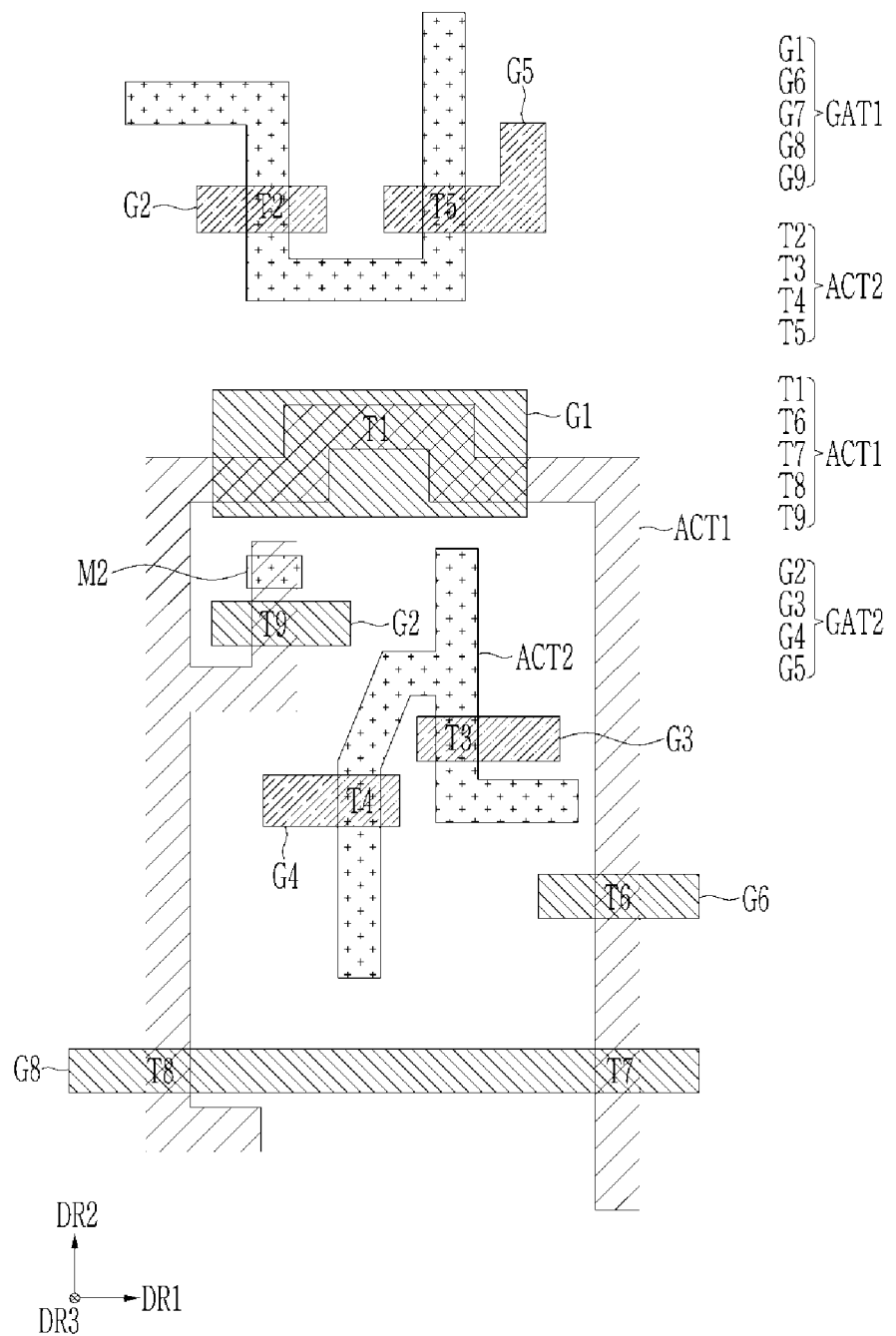
Figure 12:
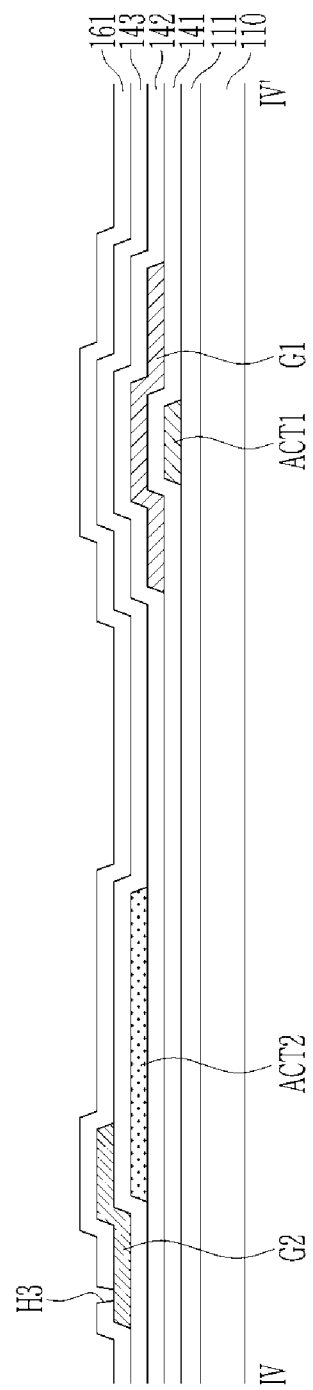

FIG. 11 and FIG. 12 illustrate the first semiconductor layer (ACT1), the first gate conductive layer (GAT1), the second semiconductor layer (ACT2), and the second gate conductive layer (GAT2). The second gate conductive layer (GAT2) may be positioned on the third gate insulating layer 143.

The second gate conductive layer (GAT2) may include the gate electrode (G2) of the second transistor (T2), the gate electrode (G3) of the third transistor (T3), the gate electrode (G4) of the fourth transistor (T4), and the gate electrode (G5) of the fifth transistor (T5).

The doping process may be performed after the second gate conductive layer (GAT2) is formed. A portion of the second semiconductor layer (ACT2) covered by the second gate conductive layer (GAT2) is not doped, and a portion of the second semiconductor layer (ACT2) that is not covered by the second gate conductive layer (GAT2) may be doped and may have the same characteristic as the conductor.

The process for doping the second semiconductor layer (ACT2) may be performed with the n-type dopant, and the second transistor (T2), the third transistor (T3), the fourth transistor (T4), and the fifth transistor including a second semiconductor layer (ACT2) may have the n-type transistor characteristic.

Referring to FIG. 4 and FIG. 12, an interlayer insulating layer 161 may be positioned on the second gate conductive layer (GAT2). The interlayer insulating layer 161 may include a silicon oxide (SiOx), a silicon nitride (SiNx), and a silicon oxynitride (SiOxNy), and may have a single-layered or multi-layered structure including the same. When the interlayer insulating layer 161 has double films, a silicon oxide layer may be positioned on a lower side and a silicon nitride layer may be positioned on an upper side.

Figure 13:
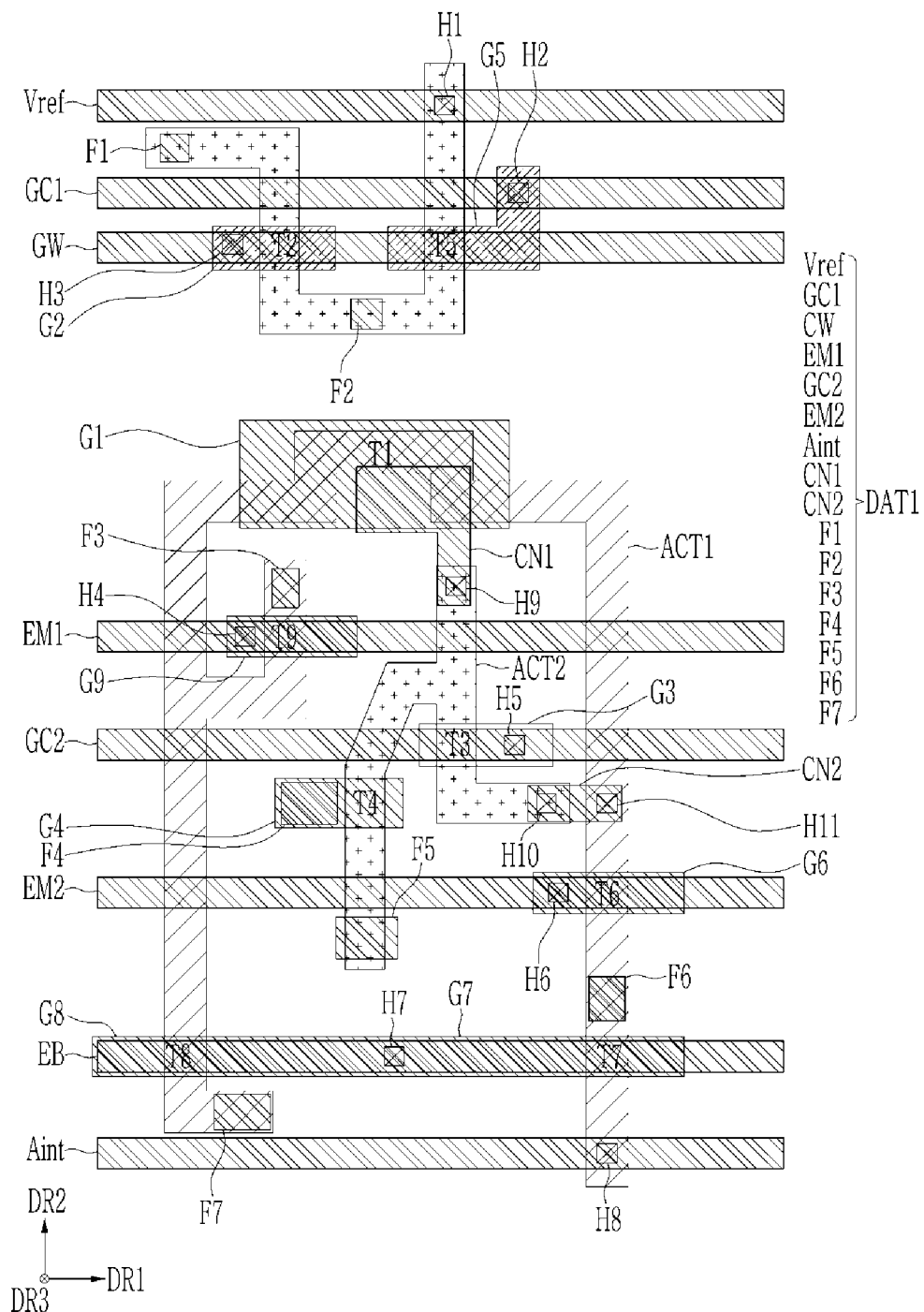
Figure 14:
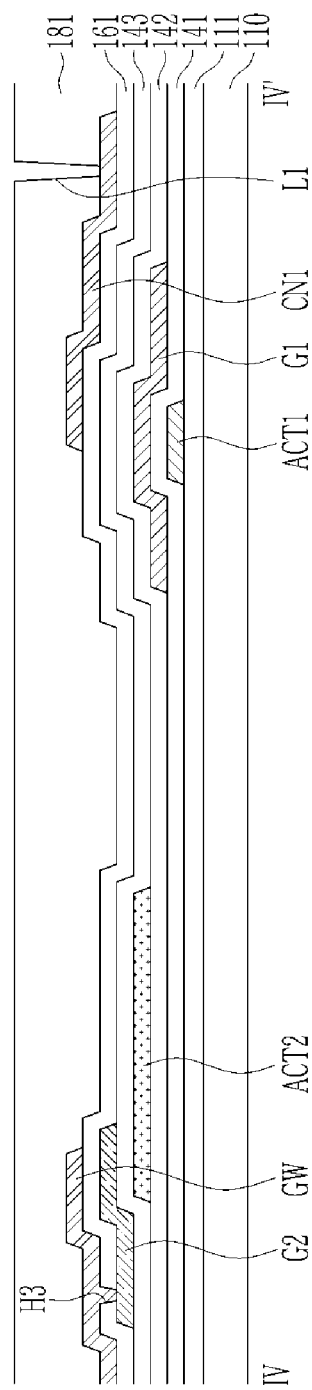

FIG. 13 and FIG. 14 illustrate the first semiconductor layer (ACT1), the first gate conductive layer (GAT1), the second semiconductor layer (ACT2), the second gate conductive layer (GAT2), and the first data conductive layer (DAT1). Referring to FIG. 3, FIG. 4, FIG. 13, and FIG. 14, the first data conductive layer (DAT1) may be positioned on the interlayer insulating layer 161. The first data conductive layer (DAT1) may include the reference voltage line (Vref), the first-A scan line (GC1), the second scan line (GW), the first emission control line (EM1), the first-B scan line (GC2), the second emission control line (EM2), the bypass control line (EB), and the anode initialization voltage line (Aint) positioned in a first direction (DR1). The first data conductive layer (DAT1) may include a first connection pattern (CN1), a second connection pattern (CN2), a first step pattern (F1), a second step pattern (F2), a third step pattern (F3), a fourth step pattern (F4), a fifth step pattern (F5), a sixth step pattern (F6), and a seventh step pattern (F7).

The reference voltage line (Vref) may be connected to the second semiconductor layer (ACT2) through a first contact hole (H1). The reference voltage line (Vref) is connected to the first electrode of the fifth transistor (T5) through the first contact hole (H1), and supplies a reference voltage to the fifth transistor (T5). The first-A scan line (GC1) may be connected to the gate electrode (G5) of the fifth transistor (T5) through a second contact hole (H2). The fifth transistor (T5) may be turned on by the scan signal transmitted through the first-A scan line (GC1).

The second scan line (GW) may be connected to the gate electrode (G2) of the second transistor (T2) through a third contact hole (H3). The second transistor (T2) may be turned on by the scan signal transmitted through the second scan line (GW).

The first emission control line (EM1) may be connected to the gate electrode (G9) of the ninth transistor (T9) through a fourth contact hole (H4). The ninth transistor (T9) may be turned on by an emission control signal transmitted through the first emission control line (EM1).

The first-B scan line (GC2) may be connected to the gate electrode (G3) of the third transistor (T3) through a fifth contact hole (H5). The third transistor (T3) may be turned on by the scan signal transmitted through the first-B scan line (GC2). The first-A scan line (GC1) and the first-B scan line (GC2) may apply the same scan signal simultaneously.

The second emission control line (EM2) may be connected to the gate electrode (G6) of the sixth transistor (T6) through a sixth contact hole (H6).

The bypass control line (EB) may be connected to the gate electrode (G7) of the seventh transistor (T7) and the gate electrode (G8) of the eighth transistor (T8) through a seventh contact hole (H7). As shown in FIG. 7, the gate electrode (G7) of the seventh transistor (T7) and the gate electrode (G8) of the eighth transistor (T8) are connected into one and are integrally positioned, so that the bypass signal may be applied to the each of the transistors (T7 and T8) through the seventh contact hole (H7). When the bypass signal is applied from the bypass control line (EB), the seventh transistor (T7) and the eighth transistor (T8) may be turned on.

The anode initialization voltage line (Aint) is connected to the first electrode of the seventh transistor (T7) through an eighth contact hole (H8). When the seventh transistor (T7) is turned on, the anode initialization voltage is transmitted to the seventh transistor.

The first connection pattern (CN1) may connect the second semiconductor layer (ACT2) and a first storage electrode (C1) to be described. Referring to FIG. 13, the first connection pattern (CN1) is connected to the second semiconductor layer (ACT2) through a ninth contact hole (H9). The third transistor (T3) and the driving transistor (T1) may be connected to each other through the first connection pattern (CN1). The driving transistor (T1) and the storage capacitor (Cst) may be connected to each other, which will be described in a later portion of the present specification.

The second connection pattern (CN2) may connect the first semiconductor layer (ACT1) and the second semiconductor layer (ACT2). The second connection pattern (CN2) may be connected to the second semiconductor layer (ACT2) through a tenth contact hole (H10), and may be connected to the first semiconductor layer (ACT1) through an eleventh contact hole (H11). The third transistor (T3) and the sixth transistor (T6) may be connected to each other through the second connection pattern (CN2).

The first step pattern (F1), the second step pattern (F2), the third step pattern (F3), the fourth step pattern (F5), the sixth step pattern (F6), and the seventh step pattern (F7) are disposed on a contact position of a conductive layer which is positioned on an upper side of the first data conductive layer (DAT1). Thus, the first step pattern (F1), the second step pattern (F2), the third step pattern (F3), the fourth step pattern (F5), the sixth step pattern (F6), and the seventh step pattern (F7) may compensate any gap at the contact position so that the contact may be well enhanced. However, the step patterns may be omitted depending on embodiments.

Referring to FIG. 4 and FIG. 14, a first insulating layer 181 may be positioned on the first data conductive layer (DAT1). The first insulating layer 181 may include an organic insulating material such as a general purpose polymer such as polymethyl methacrylate (PMMA) or polystyrene (PS), or a polymer derivative having a phenol-based group, an acryl-based polymer, an imide-based polymer, a polyimide, and a siloxane-based polymer.

Figure 15:
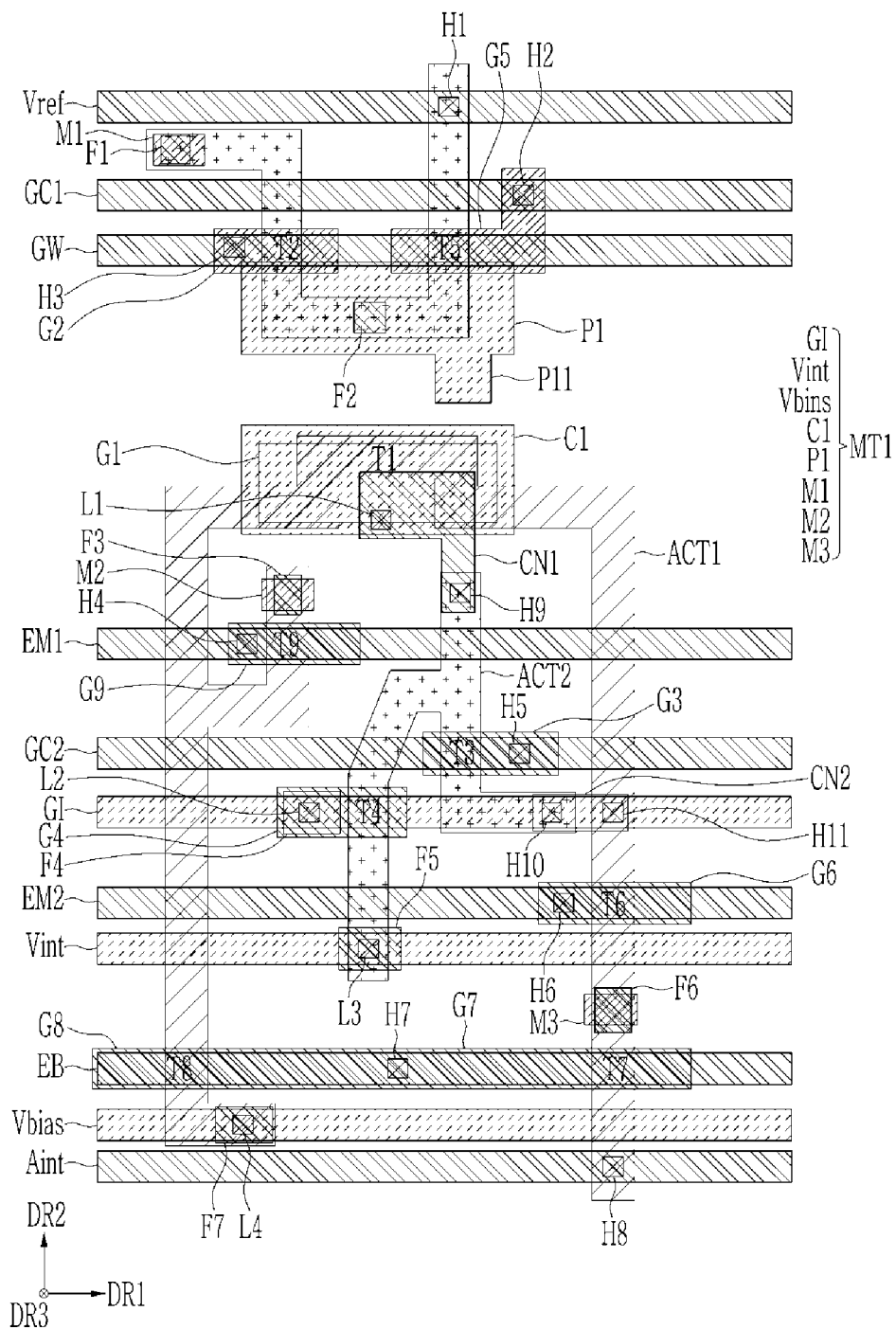
Figure 16:
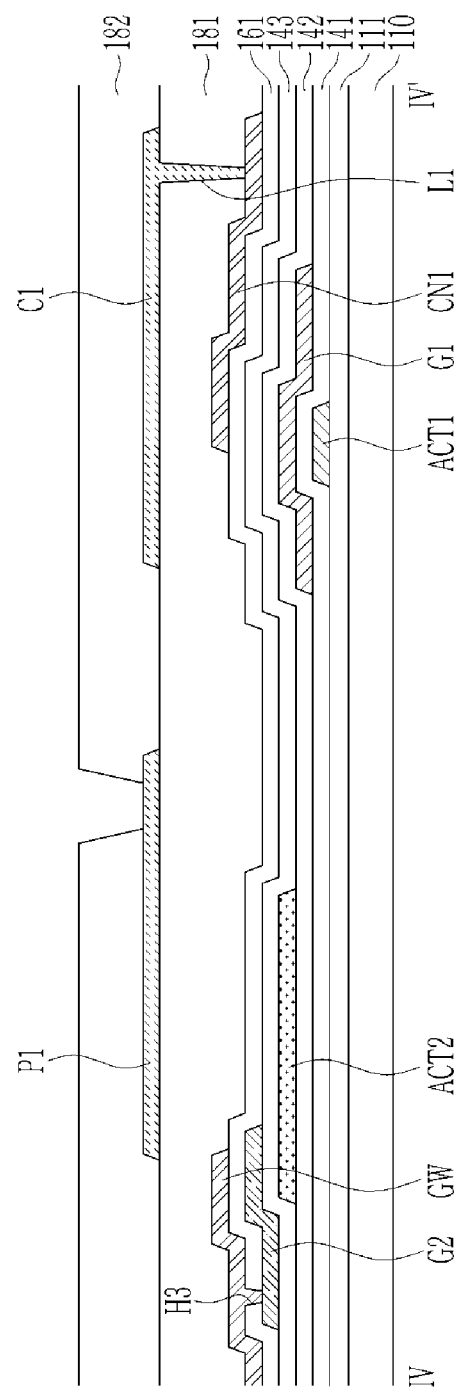

FIG. 15 and FIG. 16 illustrate the first semiconductor layer (ACT1), the first gate conductive layer (GAT1), the second semiconductor layer (ACT2), the second gate conductive layer (GAT2), the first data conductive layer (DAT1), and a first metal layer (MT1).

Referring to FIG. 3, FIG. 4, FIG. 15, and FIG. 16, the first metal layer (MT1) is positioned on the first insulating layer 181. The first metal layer (MT1) may include an initialization control line (GI), an initialization voltage line (Vint), and a bias voltage line (Vbias) positioned in the first direction (DR1). The first metal layer (MT1) may include a first storage electrode (C1) and a first input electrode (P1) in a whole plate shape, and may include an eleventh step pattern (M1), a twelfth step pattern (M2), and a thirteenth step pattern (M3).

The first storage electrode (C1) is connected to the first connection pattern (CN1) through a twenty-first contact hole (L1). Referring to FIG. 15 and FIG. 16, the first connection pattern (CN1) is connected to the first storage electrode (C1) through the twenty-first contact hole (L1), and is connected to the second semiconductor layer (ACT2) through the ninth contact hole (H8). As shown in FIG. 15, the driving transistor (T1) may be connected to the storage capacitor (Cst) through the first connecting member (CN1).

The first input electrode (P1) may include a protrusion (P11) which is protruding to the first storage electrode (C1). The first input electrode (P1) may be connected to a second storage electrode (C2) at the protrusion (P11).

Referring to FIG. 4 and FIG. 16, a second insulating layer 182 may be positioned on the first metal layer (MT1). The second insulating layer 182 may include an organic insulating material such as a general purpose polymer such as polymethyl methacrylate (PMMA) or polystyrene (PS), or a polymer derivative having a phenol-based group, an acryl-based polymer, an imide-based polymer, a polyimide, and a siloxane-based polymer.

The initialization control line (GI) may be connected to the gate electrode (G4) of the fourth transistor (T4) through a twenty-second contact hole (L2). The fourth step pattern (F4) of the first data conductive layer (DAT1) may be positioned therebetween, and the initialization control line (GI) and the gate electrode (G4) of the fourth transistor (T4) may be connected to each other through the fourth step pattern (F4). The fourth step pattern (F4) may be omitted depending on embodiments.

The initialization voltage line (Vint) may be connected to the second semiconductor layer (ACT2) of the fourth transistor (T4) through a twenty-third contact hole (L3). The fifth step pattern (F5) of the first data conductive layer (DAT1) may be positioned therebetween. The initialization voltage line (Vint) and the second semiconductor layer (ACT2) of the fourth transistor (T4) may be connected to each other through the fifth step pattern (F5). The fifth step pattern (F5) may be omitted depending on embodiments.

Referring to FIG. 15, the initialization voltage line (Vint) may be connected to the first electrode of the fourth transistor (T4) and may transmit the initialization voltage to the fourth transistor (T4). That is, when the fourth transistor (T4) is turned on by applying a signal by the initialization control line (GI), the initialization voltage is applied to the fourth transistor (T4) through the initialization voltage line (Vint).

The bias voltage line (Vbias) may be connected to the first semiconductor layer (ACT1) of the eighth transistor (T8) through a twenty-fourth contact hole (L4). The seventh step pattern (F7) of the first data conductive layer (DAT1) may be positioned therebetween. The bias voltage line (Vbias) and the first semiconductor layer (ACT1) of the eighth transistor (T8) may be connected to each other through the seventh step pattern (F7). The seventh step pattern (F7) may be omitted depending on embodiments. Referring to FIG. 15, the bias voltage line (Vbias) may be connected to the first electrode of the eighth transistor (T8) through the twenty-fourth contact hole (L4) and may transmit the bias voltage to the first electrode of the eighth transistor (T8). That is, when the eighth transistor (T8) is turned on by applying the bypass signal, the bypass control line (EB) applies the bias voltage to the eighth transistor (T8) through the bias voltage line (Vbias).

The eleventh step pattern (M1), the twelfth step pattern (M2), and the thirteenth step pattern (M3) are disposed on the contact position of the conductive layer which is positioned on the upper side of the first metal layer (MT1). Thus, the eleventh step pattern (M1), the twelfth step pattern (M2), and the thirteenth step pattern (M3) may compensate any gap at the contact position so that the contact may be well enhanced. However, the step pattern may be omitted depending on embodiments.

Figure 17:
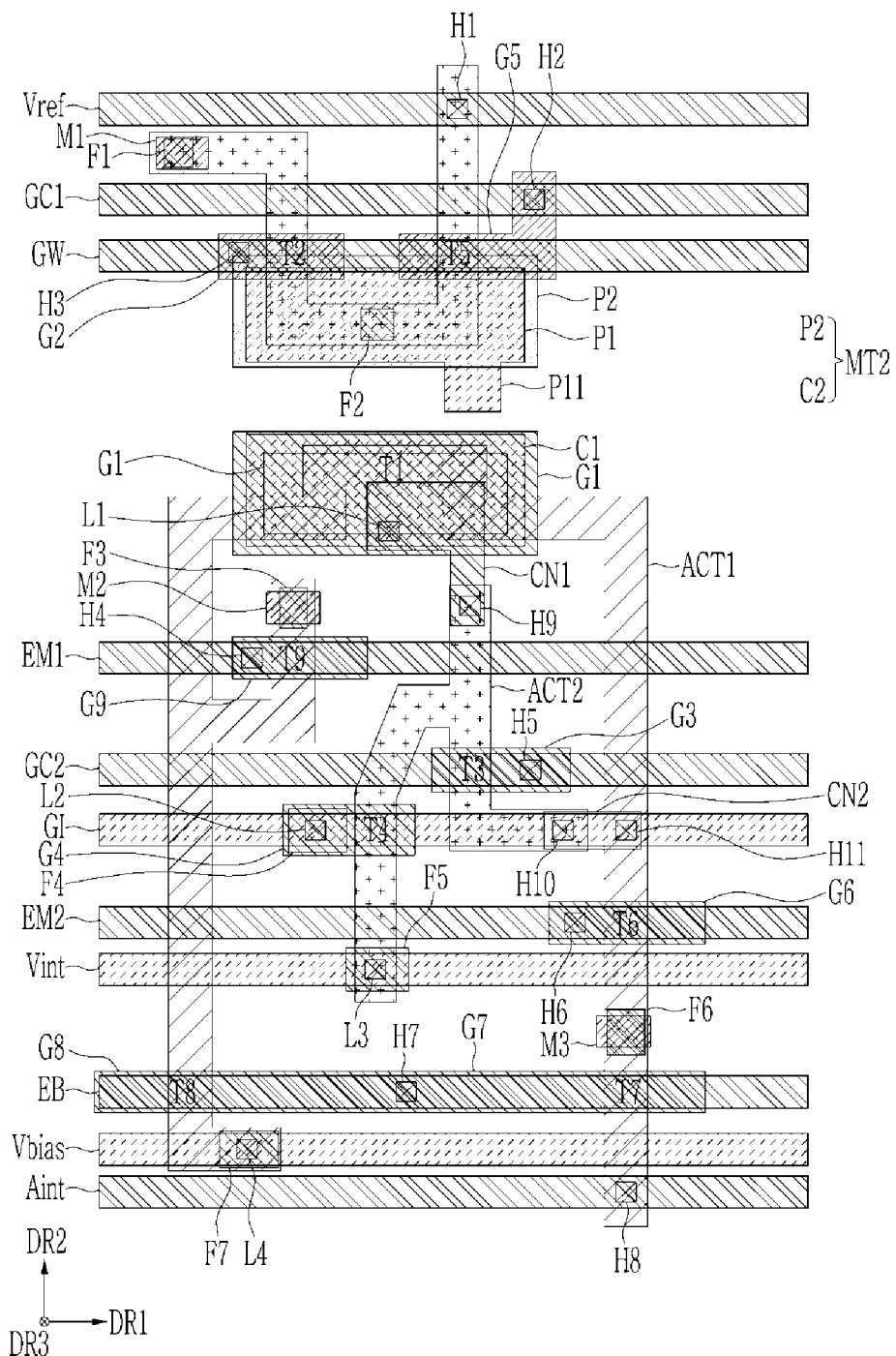
Figure 18:
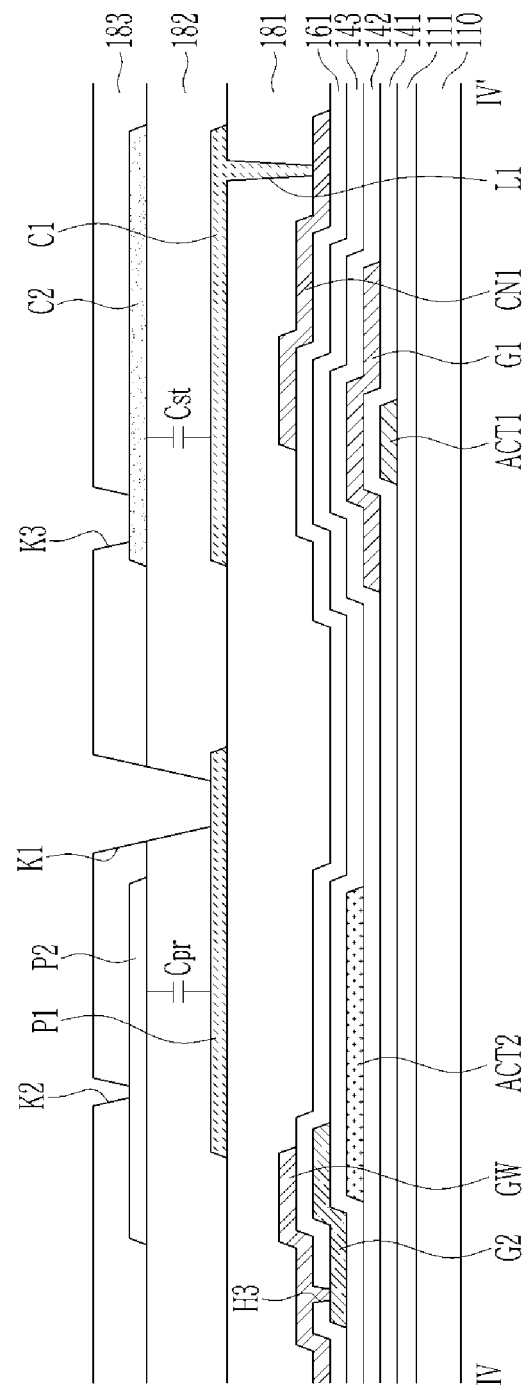

FIG. 17 and FIG. 18 illustrate the first semiconductor layer (ACT1), the first gate conductive layer (GAT1), the second semiconductor layer (ACT2), the second gate conductive layer (GAT2), the first data conductive layer (DAT1), the first metal layer (MT1), and a second metal layer (MT2).

Referring to FIG. 3, FIG. 4, FIG. 17, and FIG. 18, the second metal layer (MT2) is positioned on the second insulating layer 182. The second metal layer (MT2) may include a second storage electrode (C2) in a whole plate shape, and a second input electrode (P2) in a whole plate shape.

The second storage electrode (C2) may overlap the first storage electrode (C1) with the second insulating layer 182 therebetween and may configure the storage capacitor (Cst).

The second input electrode (P2) may overlap the first input electrode (P1) with the second insulating layer 182 therebetween and may configure the input capacitor (Cpr).

The storage capacitor (Cst) and the input capacitor (Cpr) may have the same capacitance. Therefore, the first input electrode (P1) and the second input electrode (P2) may have similar sizes. In the present specification, if the capacitor difference between the storage capacitor (Cst) and the input capacitor (Cpr) is less than 10%, then the storage capacitor (Cst) and the input capacitor (Cpr) have the same capacitance. Furthermore, if the size difference between the first input electrode (P1) and the second input electrode (P2) is less than 20%, then the first input electrode (P1) and the second input electrode (P2) have similar sizes.

Referring to FIG. 4 and FIG. 18, a third insulating layer 183 may be positioned on the second metal layer (MT2). The third insulating layer 183 may include an organic insulating material such as a general purpose polymer such as polymethyl methacrylate (PMMA) or polystyrene (PS), or a polymer derivative having a phenol-based group, an acryl-based polymer, an imide-based polymer, a polyimide, and a siloxane-based polymer.

The third insulating layer 183 and the second insulating layer 182 may include a thirty-first contact hole (K1) overlapping the protrusion (P11) of the first input electrode (P1). The third insulating layer 183 may include a thirty-second contact hole (K2) overlapping the second input electrode (P2), and a thirty-third contact hole (K3) overlapping the second storage electrode (C2).

Figure 19:
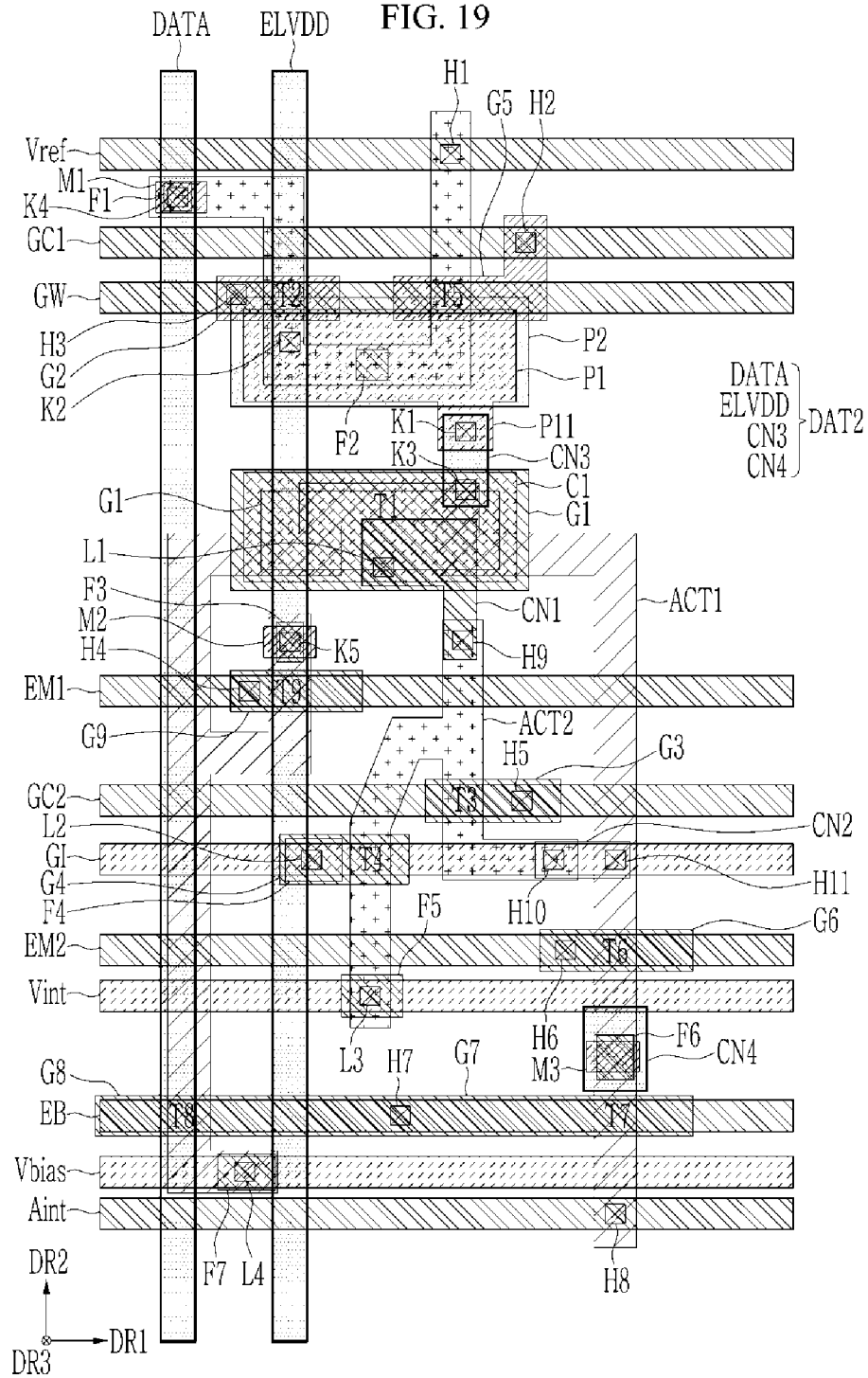
Figure 20:
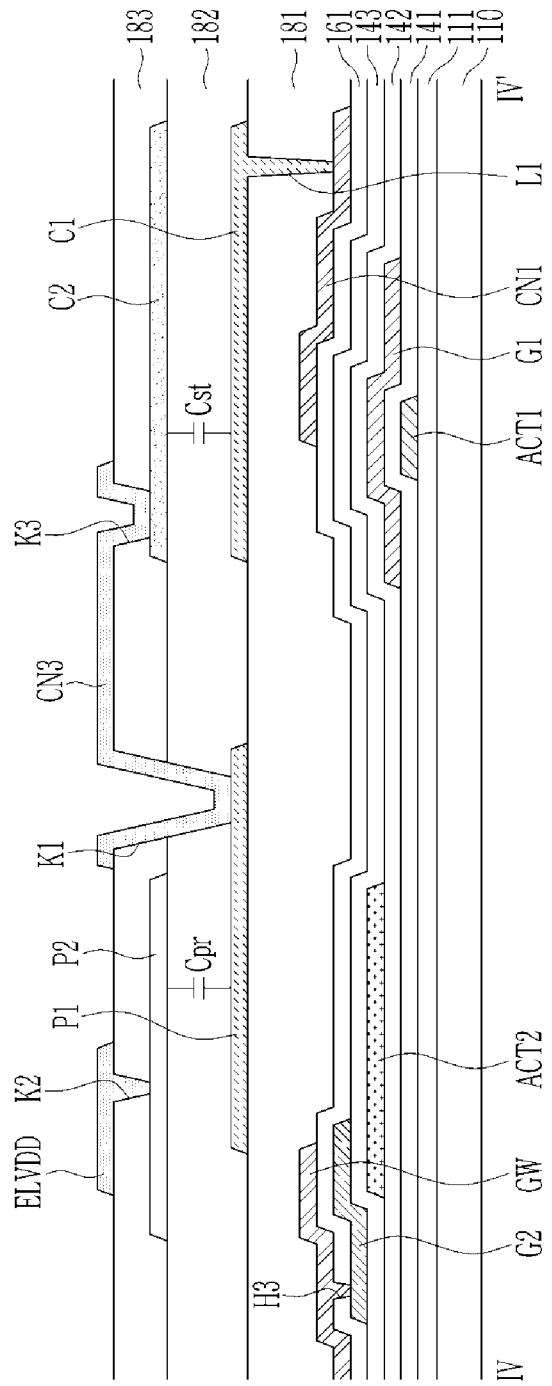

FIG. 19 and FIG. 20 illustrate the first semiconductor layer (ACT1), the first gate conductive layer (GAT1), the second semiconductor layer (ACT2), the second gate conductive layer (GAT2), the first data conductive layer (DAT1), the first metal layer (MT1), the second metal layer (MT2), and the second data conductive layer (DAT2).

Referring to FIG. 3, FIG. 4, FIG. 19, and FIG. 20, a second data conductive layer (DAT2) may be positioned on the third insulating layer 183. The second data conductive layer (DAT2) may include a data line (DATA) and a driving voltage line (ELVDD) extending in a second direction (DR2), a third connection pattern (CN3), and a fourth connection pattern (CN4).

The data line (DATA) may be connected to the second semiconductor layer (ACT2) of the second transistor (T2) through a thirty-fourth contact hole (K4). The first step pattern (F1) of the first data conductive layer (DAT1) and the eleventh step pattern (M1) of the first metal layer (MT1) may be positioned therebetween. The data line (DATA) and the second semiconductor layer (ACT2) of the second transistor (T2) may be connected to each other through the first step pattern (F1) and the eleventh step pattern (M1). However, the step pattern may be omitted depending on embodiments. The data line (DATA) may be connected to the first electrode of the second transistor (T2) and may apply the data voltage to the second transistor.

The driving voltage line (ELVDD) may be connected to the second input electrode (P2) through a thirty-second contact hole (K2). Therefore, the driving voltage may be transmitted to the input capacitor (Cpr). The driving voltage line (ELVDD) may be connected to the first semiconductor layer (ACT1) of the ninth transistor (T9) through a thirty-fifth contact hole (K5). The third step pattern (F3) of the first data conductive layer (DAT1) and the twelfth step pattern (M2) of the first metal layer (MT1) may be positioned therebetween.

The driving voltage line (ELVDD) and the first semiconductor layer (ACT1) of the ninth transistor (T9) may be connected to each other through the third step pattern (F3) and the twelfth step pattern (M2). However, the step pattern may be omitted depending on embodiments. The driving voltage line (ELVDD) may be connected to the first electrode of the ninth transistor (T9) and may apply the driving voltage to the ninth transistor (T9).

The third connection pattern (CN3) may be connected to the first input electrode (P1) through the thirty-first contact hole (K1), and may be connected to the second storage electrode (C2) through the thirty-third contact hole (K3). That is, the third connection pattern (CN3) may connect the second storage electrode (C2) and the first input electrode (P1) to thus connect the storage capacitor (Cst) and the input capacitor (Cpr).

Figure 21:
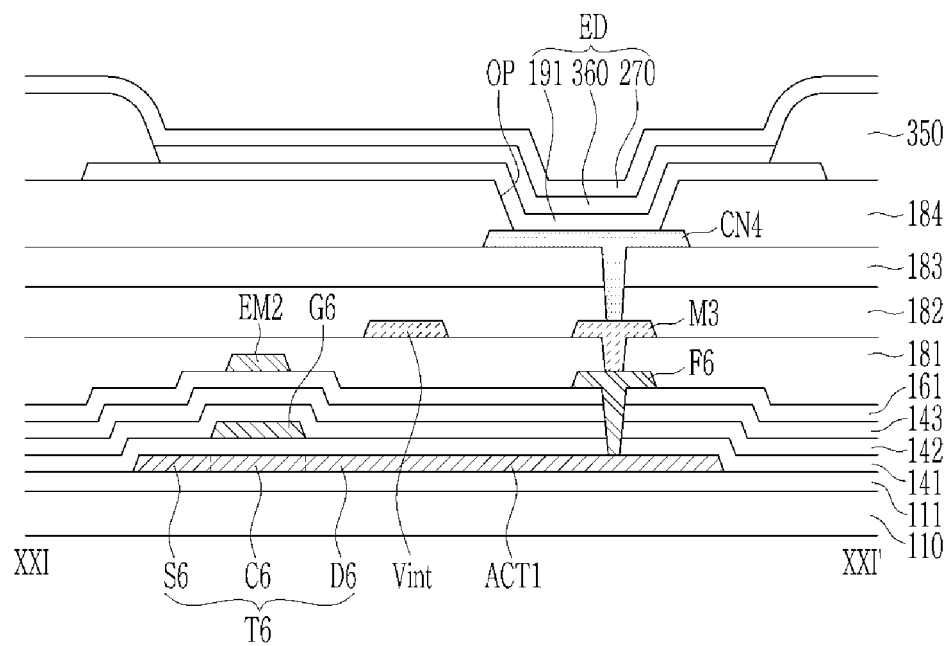
FIG. 21 shows a cross-sectional view with respect to line XXI-XXI' of FIG. 3.

The fourth connection pattern (CN4) may connect the sixth transistor (T6) and the anode. FIGS. 4, 5, 6, 7, 8, 9, 10, 11, 12, 13, 14, 15, 16, 17, 18, 19, and 20 show the configuration up to the second data conductive layer (DAT2), and for better comprehension and ease of description, a subsequent stacking configuration will be described with reference to FIG. 21. FIG. 21 shows a cross-sectional view with respect to a line XXI-XXI' of FIG. 3.

The stacking configuration up to the second data conductive layer (DAT2) from among the cross-sectional view of FIG. 21 corresponds to what is described above. Thus, no detailed descriptions on the same constitutional elements will be provided. That is, the substrate 100, the buffer layer 111, the first semiconductor layer (ACT1), the first gate insulating layer 141, the sixth gate electrode (G6), the second gate insulating layer 142, the third gate insulating layer 143, and the interlayer insulating layer 161 may be sequentially positioned. A portion overlapping the sixth gate electrode (G6) on the first semiconductor layer (ACT1) of FIG. 21 becomes a channel (C6) of the sixth transistor (T6), and each side of the channel become a first electrode (S6) and a second electrode (D6) of the sixth transistor (T6).

The first data conductive layer (DAT1) including the second emission control line (EM2) and the sixth step pattern (F6) may be positioned on the interlayer insulating layer 161.

The first insulating layer 181 may be positioned on the first data conductive layer (DAT1), and the first metal layer (MT1) including the initialization voltage line (Vint) and the thirteenth step pattern (M3) may be positioned on the first insulating layer 181.

The second insulating layer 182 and the third insulating layer 183 may be positioned on the first metal layer (MT1).

The fourth connection pattern (CN4) that is the second data conductive layer (DAT2) is positioned on the third insulating layer 183. As can be found with reference to FIG. 21, the second electrode (D6) of the sixth transistor (T6) may be connected to the fourth connection pattern (CN4) through the sixth step pattern (F6) and the thirteenth step pattern (M3). The fourth connection pattern (CN4) may be disconnected by the step directly connected to the second electrode (D6), and when it is connected through the step pattern, stable connection is possible. The above-noted connection method is identically applied to the above-described step pattern.

A fourth insulating layer 184 may be positioned on the second data conductive layer (DAT2) including the fourth connection pattern (CN4). A contact hole (OP) for exposing the fourth connection pattern (CN4) is defined in the fourth insulating layer 184.

A first electrode 191 may be positioned on the fourth insulating layer 184. The first electrode 191 may contact the fourth connection pattern (CN4) in the contact hole (OP).

A partition wall 350 including an opening overlapping the first electrode 191 may be positioned on the first electrode 191. A light-emitting device layer 360 may be positioned in the opening of the partition wall 350, and a second electrode 270 may be positioned on the partition wall 350 and the light-emitting device layer 360. The first electrode 191, the light-emitting device layer 360, and the second electrode 270 may configure the light-emitting device (ED).

As described above, the display device according to the present embodiment included nine transistors and two capacitors, and separately performed compensation of the display device and the data writing. When the compensation of the display device and the data writing are simultaneously performed, the two operations must be performed within a time of 1H, so there is a limit in the fast driving for reducing the time of 1H. However, the display device according to the present embodiment separately progresses the compensation and the data writing driving, so that high resolution and fast driving are possible.

Further, according to the present embodiment, the semiconductor layer is a combination of the oxide semiconductor layer and the polycrystalline semiconductor layer, and it may efficiently reduce a leakage of the gate node of the driving transistor, compared to the circuit configured with the polycrystalline semiconductor layer, so that it is advantageous in the driving at a low frequency of equal to or less than 30 Hz. However, when the semiconductor layer is the combination of the oxide semiconductor layer and the polycrystalline semiconductor layer as described above, the number of wires increases and the number of contacts in the pixel increases, so it is difficult to realize the high resolution. Particularly, as the storage capacitor and the input capacitor must have the same capacitance, the area of the capacitors occupied in the same plane requires twice the conventional configuration, so that it is difficult to realize the high resolution.

However, regarding the display device according to the present embodiment, the storage capacitor and the input capacitor are formed on the first data layer. That is, the additional first metal layer and second metal layer are formed on the gate electrode of the transistor, thereby solving the problem that the conventional configuration has a limit of resolution. As the electrodes configuring the storage capacitor and the input capacitor are individually positioned on the transistors, freedom of design increases, and very high resolution design is possible. In this case, the capacitors may be formed on the upper sides of the transistors, so that it is easier to select the positions of the capacitors than in the prior art. Here, the limit of resolution caused by the wires may be solved by applying some of the wires with the wire positioned on the same layer as the first metal layer.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a substrate;
a first semiconductor layer disposed on the substrate and having a plurality of transistors;
a second semiconductor layer disposed on the first semiconductor layer and having a plurality of transistors;
a first data conductive layer disposed on the second semiconductor layer;
a first metal layer disposed on the first data conductive layer; and
a second metal layer disposed on the first metal layer,
wherein the first metal layer includes a first storage electrode and a first input electrode,
the second metal layer includes a second storage electrode and a second input electrode,
the first storage electrode and the second storage electrode configure a storage capacitor, and
the first input electrode and the second input electrode configure an input capacitor.

2. The display device of claim 1, further comprising
a first gate conductive layer disposed between the first semiconductor layer and the second semiconductor layer,
wherein the first gate conductive layer includes a first gate electrode, a sixth gate electrode, a seventh gate electrode, an eighth gate electrode, and a ninth gate electrode.

3. The display device of claim 2, further comprising
a second gate conductive layer disposed between the second semiconductor layer and the first metal layer,
wherein the second gate conductive layer includes a second gate electrode, a third gate electrode, a fourth gate electrode, and a fifth gate electrode.

4. The display device of claim 3, wherein
the first semiconductor layer includes a polycrystalline semiconductor, and
the first semiconductor layer configures a first transistor, a sixth transistor, a seventh transistor, an eighth transistor, and a ninth transistor together with the first gate conductive layer.

5. The display device of claim 4, wherein
the second semiconductor layer includes an oxide semiconductor, and
the second semiconductor layer configures a second transistor, a third transistor, a fourth transistor, and a fifth transistor together with the second gate conductive layer.

6. The display device of claim 5, further comprising
an initialization control line, an initialization voltage line, and a bias voltage line disposed on a same layer as the first metal layer, wherein the initialization control line is connected to the fourth gate electrode,
the initialization voltage line is connected to a second semiconductor layer of the fourth transistor, and
the bias voltage line is connected to a first semiconductor layer of the eighth transistor.

7. The display device of claim 5, wherein
the first storage electrode is electrically connected to a second semiconductor layer of the third transistor.

8. The display device of claim 5, further comprising
a second data conductive layer disposed on the second metal layer,
wherein the second data conductive layer includes a data line, a driving voltage line, and a connecting member.

9. The display device of claim 8, wherein
the first input electrode and the second storage electrode are connected to each other through the connecting member.

10. The display device of claim 9, wherein
the first input electrode includes a protrusion which does not overlap the second input electrode, and
the first input electrode is connected to the second storage electrode at the protrusion.

11. The display device of claim 8, wherein
the second input electrode is electrically connected to the data line.

12. The display device of claim 5, wherein
the storage capacitor overlaps the first transistor.

13. The display device of claim 5, wherein
the input capacitor overlaps a portion of the second transistor and a portion of the fifth transistor.

14. The display device of claim 5, wherein
the display device includes a first emission control line and a second emission control line disposed on a same layer as the first data conductive layer,
the first emission control line is connected to the ninth gate electrode, and
the second emission control line is connected to the sixth gate electrode.

15. The display device of claim 1, wherein
capacitance of the storage capacitor corresponds to capacitance of the input capacitor.

16. A display device comprising:
a substrate;
a plurality of transistors disposed on the substrate and including a polycrystalline semiconductor;
a plurality of transistors disposed on a plurality of transistors including the polycrystalline semiconductor and including an oxide semiconductor; and
a first capacitor and a second capacitor which are disposed on the transistors including an oxide semiconductor.

17. The display device of claim 16, wherein
the first capacitor and the second capacitor are disposed on a same layer.

18. The display device of claim 17, further comprising:
a first data conductive layer disposed between the transistors including an oxide semiconductor and the first capacitor; and
a second data conductive layer disposed on the first capacitor.

19. The display device of claim 16, wherein
the first capacitor includes a first electrode connected to the first data conductive layer and a second electrode connected to the second data conductive layer.

20. The display device of claim 19, wherein
the display device includes a plurality of wires connected to the transistors,
at least some of the wires are disposed on a same layer as the first data conductive layer, and
at least some of the wires are disposed on a same layer as the first electrode.

* * * * *